(12) United States Patent
Patel

(10) Patent No.: US 6,421,240 B1
(45) Date of Patent: Jul. 16, 2002

(54) COOLING ARRANGEMENT FOR HIGH PERFORMANCE ELECTRONIC COMPONENTS

(75) Inventor: Chandrakant D. Patel, Fremont, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/845,367

(22) Filed: Apr. 30, 2001

(51) Int. Cl.[7] .................................................. H05K 7/20
(52) U.S. Cl. ........................ 361/699; 361/698; 361/695; 361/696; 361/701; 361/702; 174/15.1; 165/80.4; 165/104.33
(58) Field of Search .................................. 361/688–691, 361/694–704, 707, 711, 719–721; 257/712, 714, 715; 174/15.1, 15.2, 16.1, 16.3; 165/80.2, 80.3, 80.4, 104.33; 454/184

(56) References Cited

U.S. PATENT DOCUMENTS

| | | | | |
|---|---|---|---|---|
| 4,644,385 A | * | 2/1987 | Nakanishi et al. | 257/713 |
| 4,652,970 A | * | 3/1987 | Watari et al. | 361/699 |
| 4,879,629 A | * | 11/1989 | Tustaniwskyj et al. | 361/699 |
| 5,014,117 A | | 5/1991 | Horvath et al. | |
| 5,323,847 A | * | 6/1994 | Koizumi et al. | 165/104.33 |
| 5,370,178 A | | 12/1994 | Agonafer et al. | |
| 5,471,850 A | * | 12/1995 | Cowans | 62/223 |
| 5,509,468 A | * | 4/1996 | Lopez | 165/144 |
| 5,823,005 A | * | 10/1998 | Alexander et al. | 361/695 |
| 5,934,368 A | * | 8/1999 | Tanaka et al. | 165/233 |
| 5,963,425 A | * | 10/1999 | Chrysler et al. | 361/695 |
| 6,055,157 A | | 4/2000 | Bartilson | |
| 6,104,611 A | * | 8/2000 | Glover et al. | 361/700 |
| 6,111,749 A | | 8/2000 | Lamb et al. | |
| 6,137,682 A | * | 10/2000 | Ishimine et al. | 361/704 |
| 6,144,013 A | * | 11/2000 | Chu et al. | 219/209 |

FOREIGN PATENT DOCUMENTS

| | | | | |
|---|---|---|---|---|
| DE | 004327444 A1 | * | 2/1995 | 361/678 |
| JP | 404154200 A | * | 5/1992 | 361/702 |

* cited by examiner

*Primary Examiner*—Boris Chervinsky

(57) ABSTRACT

A cooling arrangement facilitates the cooler and quieter operation of an electronic system located within an enclosure, wherein the electronic system includes a plurality of circuit boards having a plurality of integrated circuit elements disposed within a lower portion of the enclosure. In one embodiment, the cooling arrangement includes a pump located within the enclosure that has a first and second coolant ports and a heat exchanger that is disposed within a top portion of the enclosure and is coupled to the first coolant port. The cooling arrangement also includes a thermally conductive member having a first surface and a second surface, the first surface being in thermal contact with at least one of the integrated circuit elements. A first cooling plate arrangement having a coolant channel with a first end coupled to the second coolant port and a second end coupled to the heat exchanger. A cold plate is included in the cooling arrangement that is in thermal contact with the second surface of the thermally conductive member.

14 Claims, 7 Drawing Sheets

COOLING ARRANGEMENT FOR HIGH PERFORMANCE ELECTRONIC COMPONENTS

FIELD OF THE INVENTION

The present invention generally relates to cooling systems, and more particularly to cooling arrangements for electronic systems.

BACKGROUND OF THE INVENTION

As computers and computing systems increase in processing power and memory size there is a competing goal to provide these capabilities in ever decreasing packaging sizes. However, as the density of the memory and processing components within computing systems increases, heat dissipation becomes an increasingly important design factor. Major sources of heat in such computing subsystems include microprocessors and hard disk drive assemblies. As new workstations and servers are developed they will incorporate multiple hard disk drive assemblies in close proximity to each other, thus posing a significant thermal cooling challenge.

In the past, computer systems of this kind have incorporated within their enclosures cooling devices such as heat sinks, extended surface devices applied directly to disk drive assemblies, and air movers in the form of fans to increase air mass flow rates. Air volume flow rates on the order of 2.5 to 5 liters/second, at a velocity of 2 to 3 meters/second, typically have been required for each microprocessor. Large multi-processor systems and large multi-disk drive systems used in dedicated computer rooms can be cooled by moving air at high mass flow rates with the resulting acoustic noise generally having to be tolerated. On the other hand, multiple processor and multiple disk systems used in office environments must meet more stringent acoustic emission guidelines, regulations, and customer/user requirements. In these cases, cooling the systems by increasing the air mass flow rates is not a practical option.

Efforts have been made in the past to cool electronic systems using a working fluid that undergoes a reversible phase change. In particular, power-dissipating components such as power transistors have been mounted directly to an external panel of such systems. A sealed fluid channel that carries the working fluid is formed in the panel. The working fluid absorbs heat and evaporates in the portion of the fluid channel adjacent to the power transistors. Heat is transferred to other portions of the fluid channel where the gaseous phase cools and the liquid condenses. One of the disadvantages to this approach is the inability to efficiently cool power dissipating components that are not mounted directly on the external panel.

It will be appreciated that there is a need for a system and an apparatus for effectively cooling the heat dissipating components of a computer system without increasing the computer's enclosure size and cost. A system and an apparatus that address the aforementioned problems, as well as other related problems, are therefore desirable.

SUMMARY OF THE INVENTION

The present invention is directed to addressing the above and other needs in connection with cooling electronic components and facilitating the increase of the packing density of integrated components in an electronic system. With the cooling arrangement of the present invention, microprocessor and memory modules incorporated into servers and workstations applications, that dissipate about 150 to 200 watts, each can now be placed in closer proximity to each other thereby increasing processing speed. With the present approach, multiple microprocessor systems (incorporating 32 microprocessors, dissipating about 10 to 12 kilowatts) can now be assembled at lower costs with higher levels of reliability. The present approach could also address the heat dissipation drawbacks of future hard disk drive assemblies that dissipate more than 25 watts each.

According to one aspect of the invention, a cooling arrangement is configured and arranged for cooling an electronic system located within an enclosure, wherein the electronic system includes a plurality of circuit boards having a plurality of integrated circuit elements disposed within a lower portion of the enclosure. The cooling arrangement includes a pump located within the enclosure that has a first and second coolant ports and a heat exchanger that is disposed within a top portion of the enclosure and is coupled to the first coolant port. The cooling arrangement also includes a thermally conductive member having a first surface and a second surface, the first surface being in thermal contact with at least one of the integrated circuit elements. A first cooling plate arrangement having a coolant channel with a first end coupled to the second coolant port and a second end coupled to the heat exchanger is included in the cooling arrangement that is in thermal contact with the second surface of the thermally conductive member. In a related embodiment, the thermally conductive member is part of a circuit module that is disposed on a main system board.

According to another aspect of the invention, an electronic system in combination with a cooling arrangement is located within an enclosure. The system includes a pump located within the enclosure that has a first and second coolant ports and a heat exchanger disposed within a top portion of the enclosure and coupled to the first coolant port. The system also includes a microprocessor circuit module and a memory circuit module disposed within the enclosure, the microprocessor circuit module having a microprocessor contained in a first thermally conductive housing and the memory circuit module having a memory element contained in a second thermally conductive housing. The system further includes a first and second cooling plate arrangement in thermal contact with a first surface of the respective thermally conductive housings, wherein at least one of the cooling plate arrangements has a coolant channel with a first end coupled to the second coolant port and a second end coupled to the heat exchanger.

It will be appreciated that various other embodiments are set forth in the Detailed Description and Claims that follow.

BRIEF DESCRIPTION OF THE DRAWINGS

Various aspects and advantages of the invention will become apparent upon review of the following detailed description and upon reference to the drawings in which.

Figure 1:
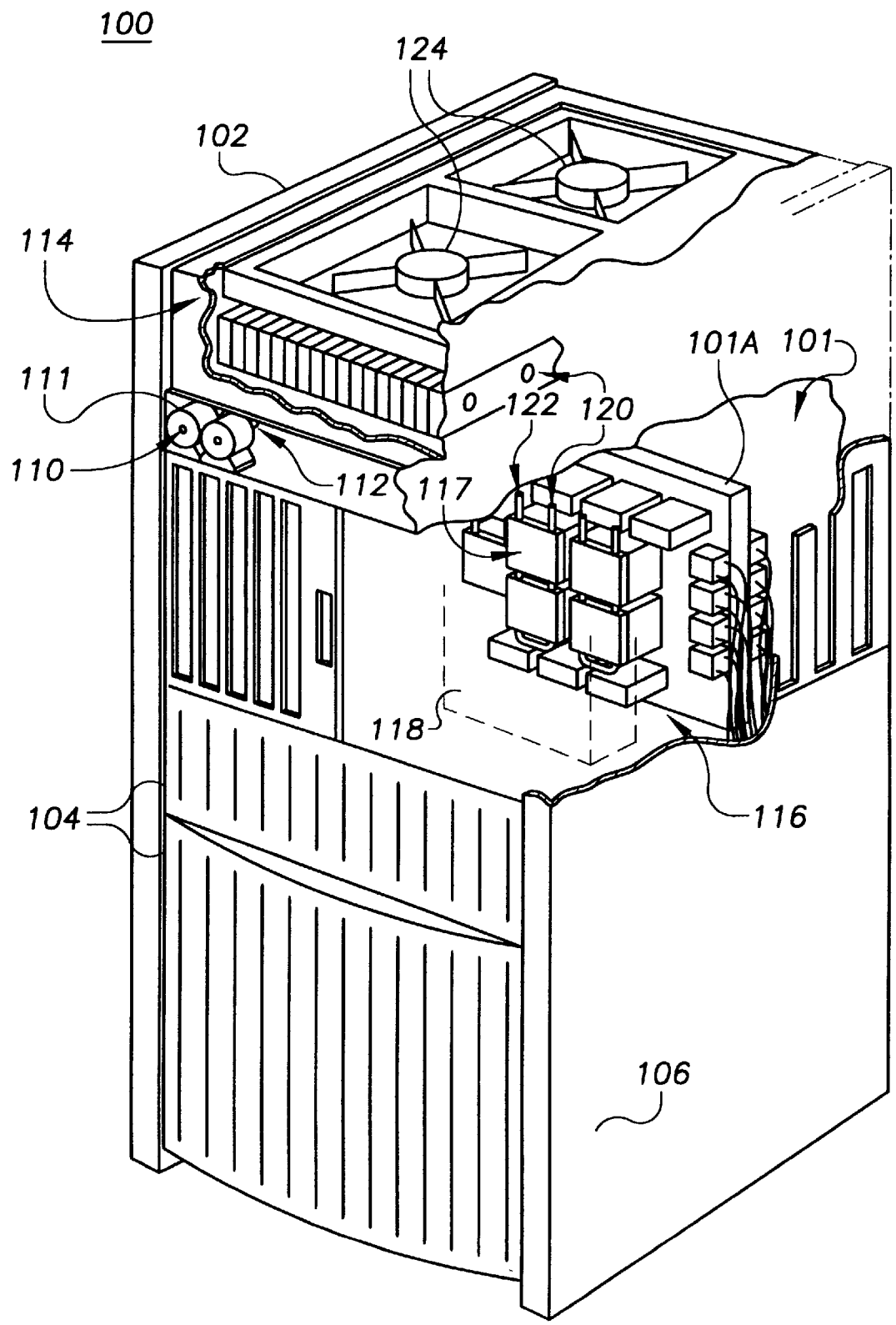
FIG. 1 illustrates a cooling arrangement for an electronic system in accordance with an example embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Various embodiments of the present invention are described in connection with cooling arrangements that facilitate high-density packaging of electronic components in electronic systems. In addition, an electronic system in combination with the cooling arrangement of the present invention provides a cooler and quieter electronic operating system. Those skilled in the art will appreciate that the invention could be implemented with a variety of integrated circuit elements, mounting schemes and system board layouts.

Referring now to the figures, FIG. 1 illustrates a cooling arrangement 100 for an electronic system made in accordance with an example embodiment of the invention. Cooling arrangement 100 is configured and arranged for cooling an electronic system 101 located within an enclosure 102. The electronic system includes a plurality of circuit boards having a plurality of integrated circuit elements disposed within a lower portion of enclosure 102. Enclosure 102 includes a set of vents 104 that permits the front to back flow of external air through a portion 106 in which a power supply (not shown) and an I/O module (not shown) are disposed.

Cooling arrangement 100 includes a set of coolant pumps 110 located within an upper portion of enclosure 102 and having a first coolant port 111 and second coolant port 112. A heat exchanger 114 having a plurality of cooling fins is disposed within a top portion of enclosure 102 and is coupled to first coolant port 111. Electronic system 101 includes a main system board 101A having various circuit modules 116 disposed thereon. Circuit modules 116 have thermally conductive housings. Main system board 101A is discussed in more detail in the description of FIG. 2A.

A plurality of cooling plate arrangements 117 are also included and are in thermal contact with an outer surface of circuit modules 116. An optional cold plate repository member 118 is located over circuit modules 116 for temporarily storing cold plates during servicing of electronic system. The cooling plate arrangements include individual ones of or combinations of the following: a cold plate, a heat sink, and a cold plate with a coolant channel. Each of cold plate arrangements 117 has a coolant channel with a first end 120 coupled to the second coolant port and a second end 122 coupled to heat exchanger 114. Cooling arrangement 100 further includes a set of fans 124 located at the top of enclosure 102 for removing heat from the heat exchanger and preheated air from the enclosure. Preheated air is air within the enclosure that has been heated by the heat dissipated from the electronic components within the enclosure.

Pumps 110 circulate the coolant through a cooling tube at first end 120 of cold plate arrangements 117. The coolant absorbs heat that is generated by integrated circuit elements that are located within the circuit modules. Heated coolant flows out of second end 122 of cold plate arrangement 117 and through heat exchanger 114. The heat from the coolant dissipates within heat exchanger 114 and is drawn up and out of enclosure of 102 via fans 124. Where space is a premium one large fan having a variable speed capability is sufficient to draw heat from heat exchanger 114 and preheated air out of enclosure 102. In a related embodiment, the single coolant tube can also be divided into multiple tubes that circulate in the cold plate arrangements or is a single tube that circulates in series through the cold plates before circulating into the heat exchanger. One example of a coolant includes eythlene gycol mixed with water. An advantage to this cooling arrangement is that heat is efficiently transferred from the circuit modules to the top of enclosure 102 without having to sacrifice open space normally required for placing heat sinks locally on modules. The present invention provides more circuit board space within enclosure 102 while providing for cooler operating electronic systems and components.

Figure 2A:
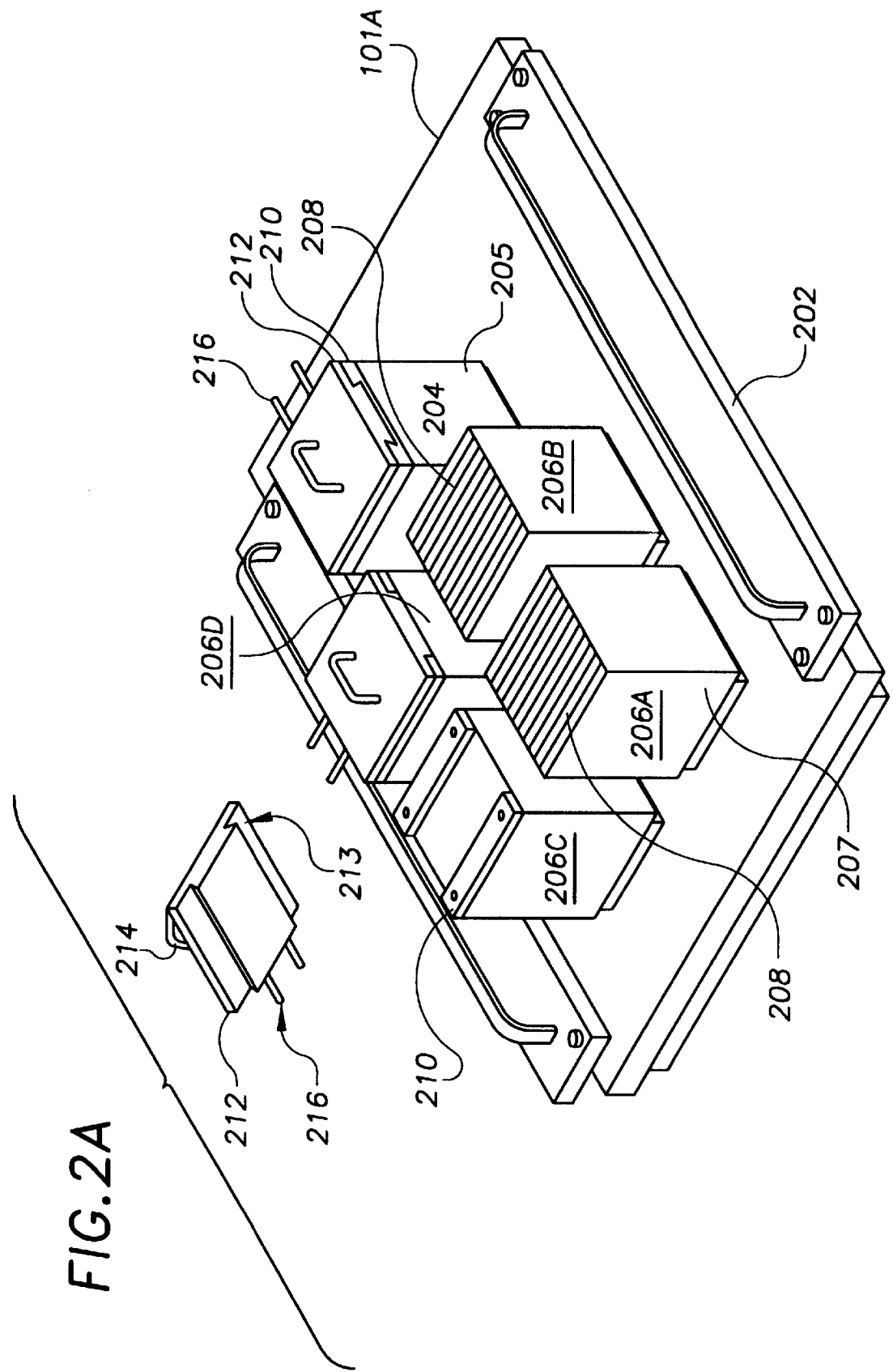
FIG. 2A illustrates a system board for an electronic system having various circuit modules in accordance with an example embodiment of the invention.

Referring now to FIG. 2A, main system board 101 of FIG. 1 includes multiple circuit modules for cooling integrated circuit elements in accordance with an example embodiment of the invention. In particular, system board 101 A includes a microprocessor circuit module 204 adjacent a plurality of memory circuit modules 206A–206D. The close proximity of the microprocessor with the memory elements provides the advantage of increasing processing speed by reducing the microprocessor to memory path length. Microprocessor circuit module 204, in this example, includes at least one microprocessor contained in a first thermally conductive housing 205. Likewise, memory circuit module 206A includes at least one memory element contained in a second thermally conductive housing 207. System board 101A includes a pair of handles 202 for easily removing system board 101A from enclosure 102 for service. Field serviceability of the electronic system on system board 101A is simplified when using circuit modules 204 or 206 since the entire module can be easily removed and replaced with a new one.

The housings of circuit modules 204–206 are made of a thermally conductive material, such as aluminum, copper or a thermally conductive ceramic. In one embodiment, a top portion 208 of the circuit modules is made of a metallic material to maximize heat transfer from the integrated circuit elements within module to top portions 208. A heat sink 210 and a cold plate 212 are also included on one or more of the conductive housings. An edge 243 of cold plate 212 is configured in a dovetail shape to slidably attach to the conductive housing.

In the present embodiment, a set of cooling tubes 216 is coupled to a coolant channel in cold plate 212 for circulating a coolant through the cold plate. In a related embodiment, the cold plate with cooling tubes 216 is replaced with a simple cold plate without tubes or a coolant channel. A handle 214 is included on each cold plate 212 for ease of removal from heat sink 210 and from the conductive housings of the circuit module. To replace one of the circuit modules of system board 101A, cold plate 212 is slidably removed from heat sink 210, and then the circuit module is removed from the system board and replaced with a new circuit module. Once the replacement circuit module is coupled to the system board, cold plate 212 is reattached to heat sink 210. This approach greatly simplifies system upgrade and repair.

Figure 2B:
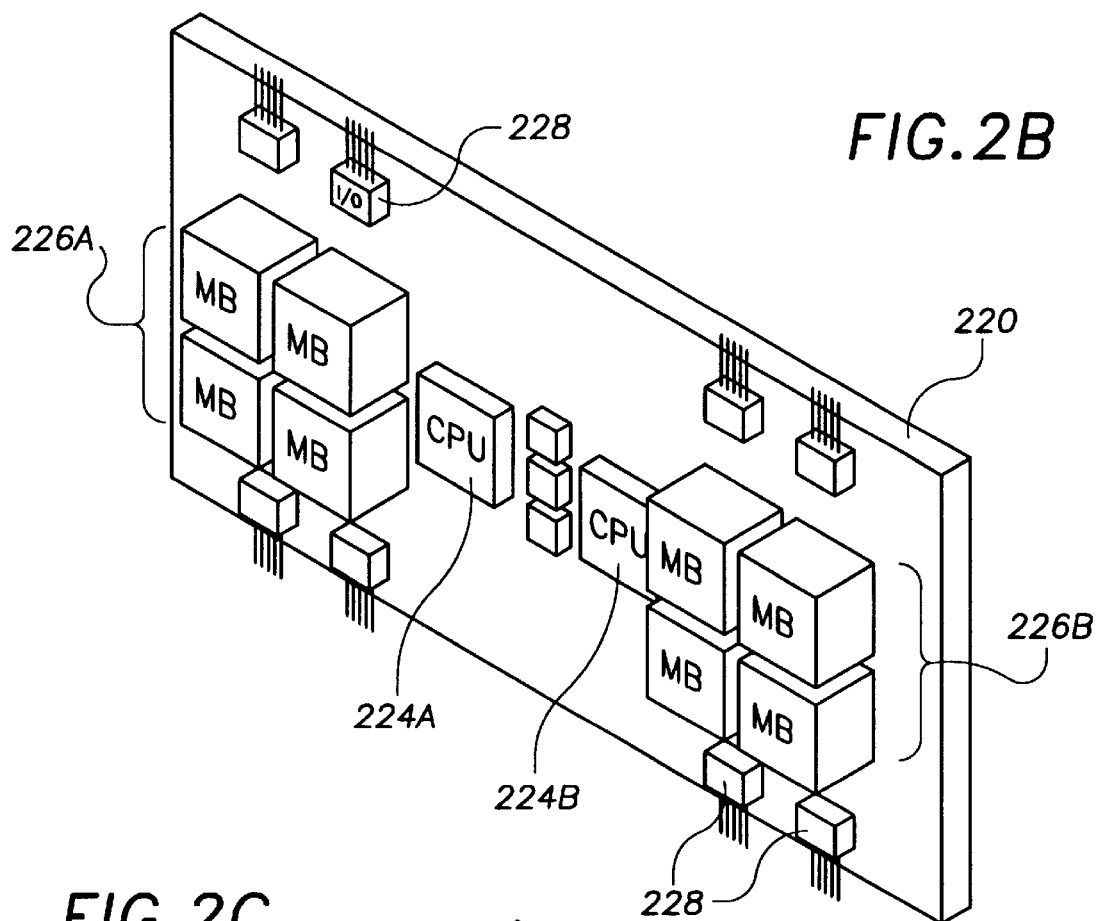
FIG. 2B illustrates a system board for an electronic system having a redundant set of circuit modules in accordance with another example embodiment of the invention.

Referring now to FIG. 2B, a system board 220 having a redundant set of circuit modules on each half of the board is made in accordance with another example embodiment of the invention. In particular, a set of microprocessor modules 224A and 224B are disposed in the center of board 220 and have a set of memory circuit modules 226A and 226B on the respective sides of the microprocessor modules. In this example, microprocessor modules 224A and 224B have 16 microprocessors within their housings, respectively. I/O elements 228 are disposed at the edge of board 220 for ease of connectivity to other components within enclosure 102. Board 220, as well as the other boards described herein, provides the advantage of increased density of microprocessor and memory packaging in a smaller space without the drawback of operating at higher and less efficient temperatures.

Figure 2C:
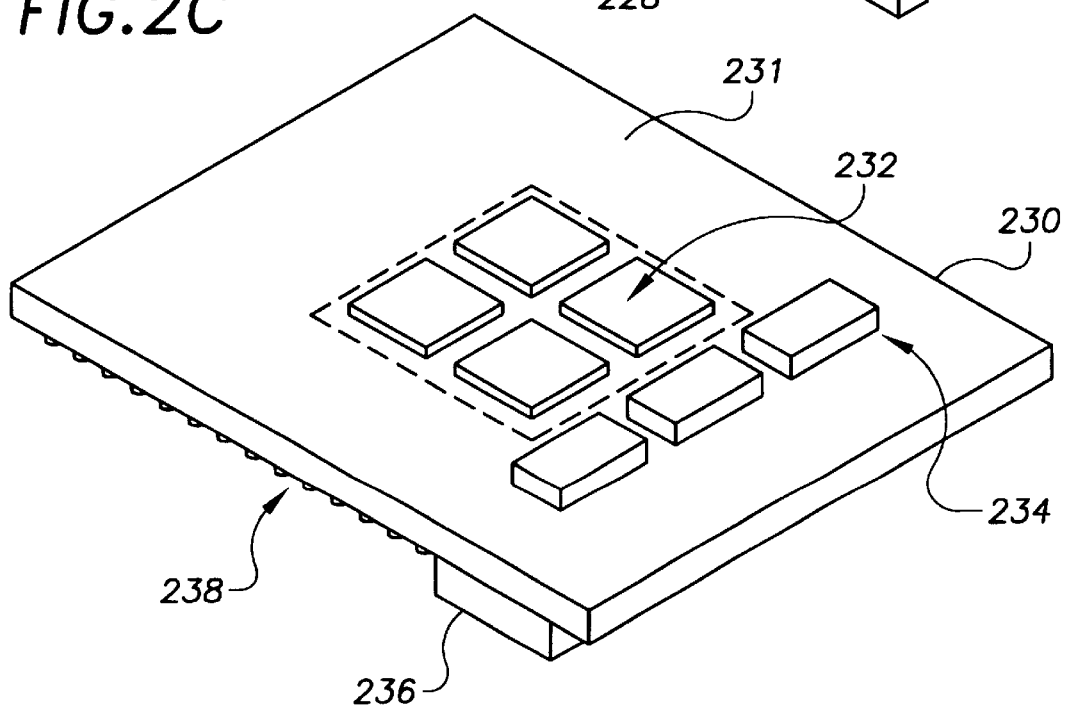
FIG. 2C illustrates a microprocessor circuit board made in accordance with an example embodiment of the invention.

Referring now to FIG. 2C, an exposed microprocessor circuit board 230 of a microprocessor module is shown in accordance with an example embodiment of the invention. Housing 205 has been removed and a set of microprocessor units 232 on a ceramic substrate 231 is exposed. Within each unit 232 are four microprocessor cores operating at about 110 amps each. Proximate to units 232 are located an array 234 of Volterra™ multiphase power converters that are coupled through substrate 231 to a set of power pins 236. Board 230 (and the circuit module) is coupled to the main system board through an LGA array 238.

Figure 2D:
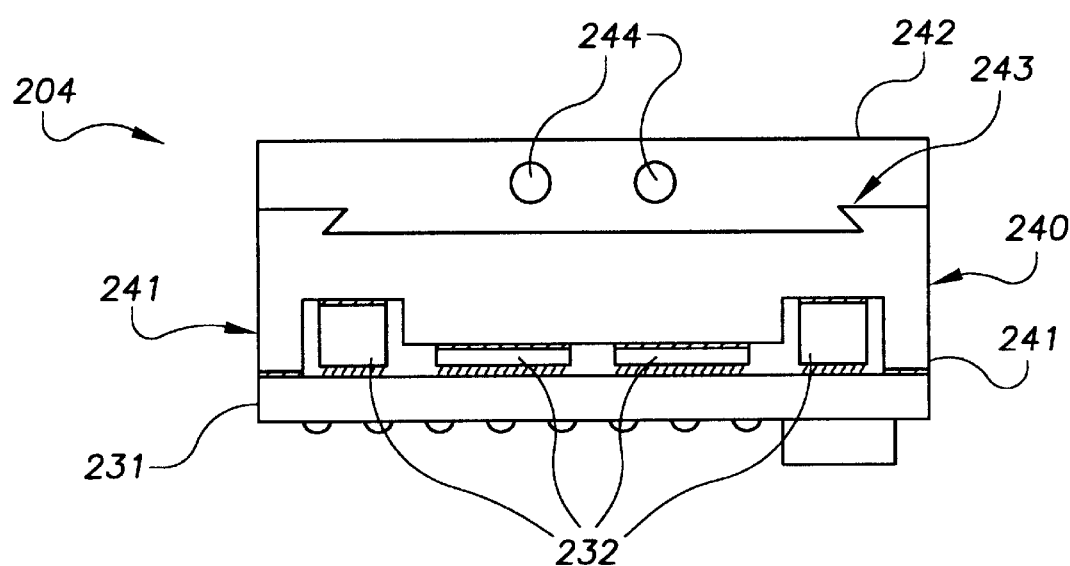
FIG. 2D illustrates a portion of a microprocessor circuit module made in accordance with an example embodiment of the invention.

Referring now to FIG. 2D, a portion of a microprocessor circuit module 204 is shown in accordance with an example embodiment of the invention. Circuit module 204 includes a heat sink 240 that is disposed over microprocessor units 232 and a cold plate 242. Cold plate 242 has a series of holes or coolant channels 244 for the flow therethrough of coolant from pump 110. In this example embodiment, heat sink 240 has two outer leg portions 241, which are in contact with substrate or circuit board 231 and that supports heat sink 240 over the microprocessors. Heat sink 240 is either in direct contact with the microprocessors or in thermal contact via a thermal compound that is interposed between the heat sink and the microprocessor.

Figure 2E:
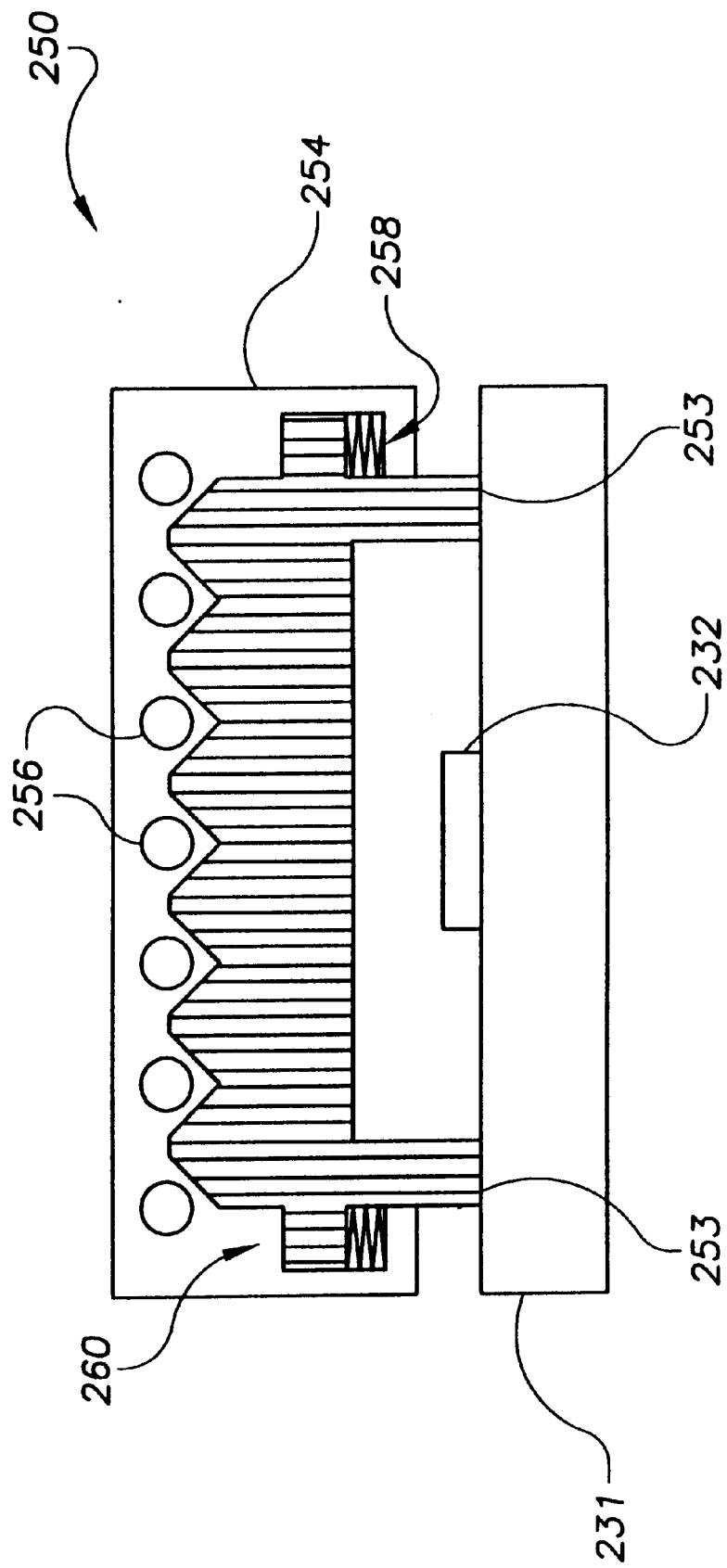
FIG. 2E illustrates a portion of a circuit module made in accordance with another example embodiment of the invention.

Referring now to FIG. 2E, a portion of a circuit module 250 (similar to module 204) is shown in accordance with another example embodiment of the invention. Circuit module 250 includes a heat sink 260, which serves as a housing for an integrated circuit element 232, that has a cold plate 254 thereon. Cold plate 254 has a series of holes or coolant channels 256 for the flow therethrough of coolant from pump 110. Cold plate 254 is supported by the corrugated surface of heat sink 260 and held in place with spring member 258. Spring member 258 acts as a retention mechanism to align cold plate 254 with heat sink 260. In this example embodiment, heat sink 260 has two outer leg portions 253, which are in contact with substrate or circuit board 231 and that heat sink 260 over the integrated circuit elements. Heat sink 260 can be either in direct contact with the integrated circuit elements or in thermal contact via a thermal compound that is interposed between the heat sink and the integrated circuit element. Where the thermal compound is used, spring member 258 acts to minimize the thickness of the compound (e.g., thermal grease) between the heat sink and the integrated circuit element. Heat sink 260 can also absorb heat from integrated circuit elements via radiation where the inner surface of heat sink 260 is anodized. The above-described embodiments are applicable to various integrated circuit elements and are not limited to microprocessor and memory elements.

Figure 3A:
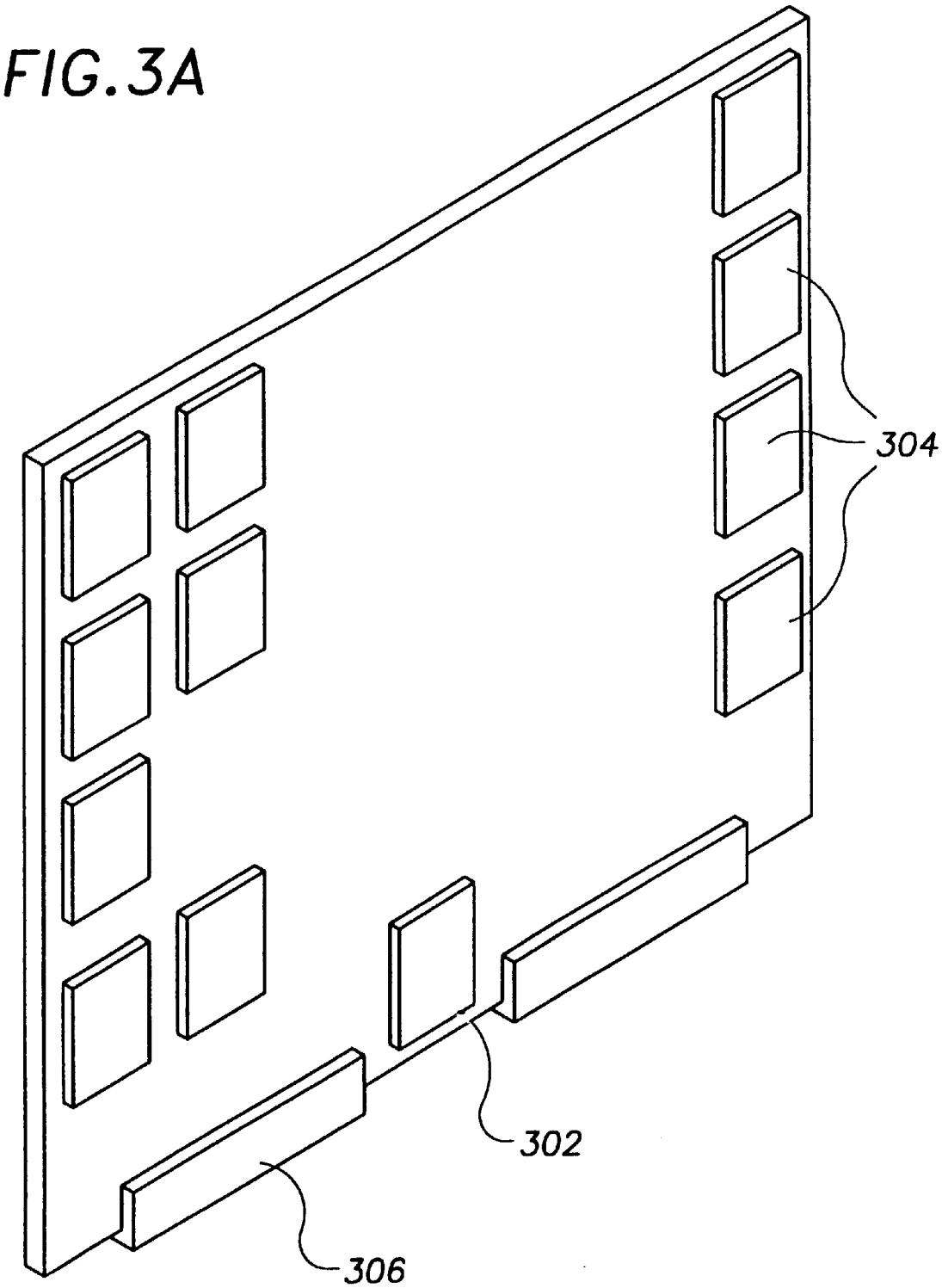
FIG. 3A illustrates an example circuit board that is part of a circuit module made in accordance with an example embodiment of the invention.

Referring now to FIG. 3A, an example circuit board 302 is shown that is a part of a circuit module made in accordance with an example embodiment of the invention. In particular, board 302 is either a printed circuit board or a wiring board that is populated with a plurality of integrated circuit elements 304 either on one or both sides of the board. In this example, the board has 4 rows and 9 columns of integrated circuit elements, but only 32 integrated circuit elements to a side. Board 302 is mounted vertically on a mounting substrate (not shown) via a mounting card edge connector 306 in a side by side relationship with other circuit boards. Various circuit boards can be strapped together to form a single circuit module.

Figure 3B:
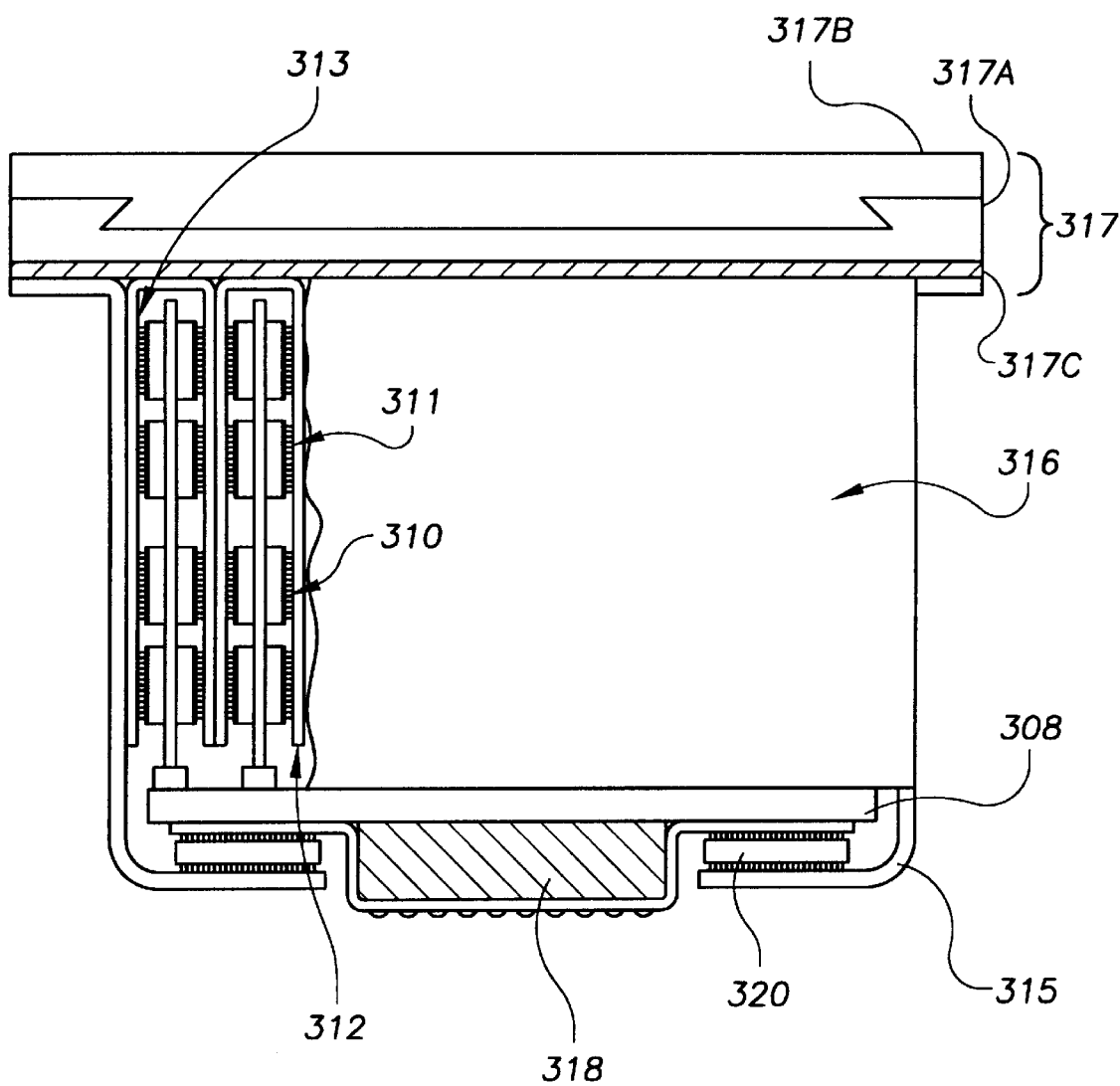
FIG. 3B illustrates a circuit module made in accordance with an example embodiment of the invention.

Referring now to FIG. 3B, a circuit module 300, similar to the circuit modules on system board 101A, is made in accordance with an example embodiment of the invention. As part of a cooling system for an electronic system, circuit module 300 facilitates the self-cooling operation of integrated circuit elements that are subcomponents of an electronic system. Circuit module 300 includes a plurality of integrated circuit elements 304, which are disposed on a plurality of substrates or circuit boards 302. Circuit boards 302 are vertically mounted on a mounting substrate 308 via a set of card edge connectors 306. A plurality of U-shaped thermally conductive members 310 are contained within a housing member 315 and are enclosed by a cooling plate arrangement 317. In one example, cooling plate arrangement 317 is in thermal contact with the housing and the U-shaped members. U-shaped members 310 are formed from metallic plates (or from planar heat pipes that contain a coolant) and have a set of leg portions 312 that are connected with a top portion 314. U-shaped members 310 also have an open end disposed over each of the circuit boards 302. An inner surface 313 of one of the leg portions is in thermal contact with integrated circuit elements 304 via a thermal compound 311 interposed between inner surface 313 and one or more of integrated circuit elements 304.

In a related embodiment, inner surfaces 313 of leg portions 312 and integrated circuit elements 304 are in direct contact with each other. Leg portions 312 operate to cool integrated circuit elements 304 by transferring heat from integrated circuit elements 304 to top portions 314. Housing member 315, primarily through housing sidewalls, also absorbs heat from leg portions 312. Sidewalls, similar to U-shaped members 310, can be formed from metallic plates or from planar heat pipes that contain a coolant. Referring to FIG. 3A, where heat pipes are used for the U-shaped members or the housing member the coolant vaporizes from absorbing heat in the leg portions and moves up the heat pipe. As the vapor condenses in transferring heat to the top portion of the housing member (or U-shaped member) the coolant returns to the bottom of the heat pipe. U-shaped members 310 are held together via a strap or frame member 316.

Cooling plate arrangement 317 is disposed on top of housing member 315 to absorb the heat transferred from the integrated circuit elements to top portions 314 and to the upper half of housing member 315. Cooling plate arrangement 317 is formed from a heat sink 317A and a cold plate 317B with cold plate 317B being disposed on heat sink 317A. In a related embodiment, an additional interface member 317C (in the form of a thin compliant thermal pad or membrane) is interposed between heat sink 317A and the top of housing member 315. Where increased heat dissipation for integrated circuit elements 304 is required, cold plate 317 can be replaced with a cold plate that includes a coolant channel. The heat is then transferred via the coolant to heat exchanger 114 and out of enclosure 102 via fans 124. To increase heat transfer to top portions 314 and to housing member 315, the leg portions of U-shaped members 310 are in contact with one another. In this example, the U-shaped members and the housing member are formed from aluminum or copper plates or from aluminum or copper heat pipes that have a coolant disposed therein.

In this example, integrated circuit elements 304 are memory devices that are supported in a plurality of circuit boards 302 (memory boards) on a first side of mounting substrate 308 (top) to form memory circuit modules 206A–206D. A second side of mounting substrate 308 (underneath) includes a connector member 318 that protrudes through an opening of a bottom portion of housing member 315 and is adapted to couple the memory boards to a main system board (not shown). Connector member 318 is a large grid array connector. A controller element 320 for controlling signals to the memory boards is in contact with the bottom portion of housing member 315 and with mounting substrate 308.

The present invention is believed to be applicable to a variety of cooling systems for high performance and compact electronic systems. The present invention has been found to be particularly applicable and beneficial in computing systems that require high-density packaging of integrated circuit elements, reduced communication path lengths and ease of field serviceability. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A cooling arrangement for an electronic system located within an enclosure, the electronic system including a plurality of circuit boards disposed within a lower portion of the enclosure and having a plurality of integrated circuit elements disposed thereon, the cooling arrangement comprising:

a pump located within the enclosure and having a first and second coolant ports;

a heat exchanger disposed within a top portion of the enclosure and coupled to the first coolant port;

a thermally conductive member having a first surface and a second surface, the first surface being in thermal contact with at least one of the integrated circuit elements, wherein the thermally conductive member includes a U-shaped member having a set of leg portions connected with a top portion and an open end disposed over a respective one of the circuit boards, a first surface of at least one of the leg portions being in contact with the circuit element; and a first cooling plate arrangement having a coolant channel with a first end coupled to the second coolant port and a second end coupled to the heat exchanger and in thermal contact with the second surface of the thermally conductive member.

2. The arrangement of claim 1, wherein the thermally conductive member includes at least two outer leg portions that are in contact with the circuit board that supports the circuit element, the leg portions adapted to support the thermally conductive member over the circuit element.

3. The arrangement of claim 1, wherein the first cooling plate arrangement includes a first cold plate disposed on a first heat sink.

4. The arrangement of claim 3, wherein the first cooling plate arrangement includes a thermal interface member disposed between the first heat sink and the thermally conductive members.

5. The arrangement of claim 1, wherein the U-shaped member has a channel extending through and within the top and leg portions of the U-shaped member and filled with a coolant that vaporizes from absorbing heat in the leg portions and condenses in transferring heat to the first cooling plate arrangement.

6. The arrangement of claim 1, further comprising a plurality of U-shaped members in a side by side relationship.

7. The arrangement of claim 1, wherein the thermally conductive member is selected from the group consisting of aluminum and copper.

8. The arrangement of claim 1, further comprising at least one fan disposed within the enclosure and above the heat exchanger.

9. An electronic system in combination with a cooling arrangement located within an enclosure, the cooling arrangement comprising:

a pump located within the enclosure and having a first and second coolant ports;

a heat exchanger disposed within a top portion of the enclosure and coupled to the first coolant port;

a microprocessor circuit module and a memory circuit module disposed within the enclosure, the microprocessor circuit module including at least one microprocessor contained in a first thermally conductive housing and the memory circuit module including at least one memory element contained in a second thermally conductive housing, wherein the memory circuit module includes a plurality of memory boards disposed on a mounting substrate and a plurality of U-shaped thermally conductive members, wherein each U-shaped conductive member is disposed over each memory board; and a first and second cooling plate arrangements in thermal contact with a first surface of the respective thermally conductive housings, wherein at least one of the cooling plate arrangements has a coolant channel with a first end coupled to the second coolant port and a second end coupled to the heat exchanger.

10. The system of claim 9, further comprising a plurality of the memory circuit modules disposed on a main system board in close proximity to the microprocessor circuit module, thereby decreasing a microprocessor to memory path length.

11. The system of claim 9, wherein the coolant channel of the cooling plate arrangement is coupled to a set of cooling tubes adapted to circulate a coolant.

12. The system of claim 9, wherein at least one of the cooling plate arrangements further comprises a cold plate disposed on a heat sink that is in thermal contact with the first surface of the conductive housings.

13. The system of claim 9, wherein the U-shaped members are formed from a material selected from the group consisting of: aluminum, copper and a thermally conductive ceramic.

14. A cooling arrangement for an electronic system located within an enclosure, the electronic system including a plurality of circuit boards disposed within a lower portion of the enclosure and having a plurality of integrated circuit elements disposed thereon, the cooling arrangement comprising:

- a pump located within the enclosure and having a first and second coolant ports;
- a heat exchanger disposed within a top portion of the enclosure and coupled to the first coolant port;
- a plurality of unshaped thermally conductive members, each having a set of leg portions connected with a top portion and an open end disposed over a respective one of the circuit boards, a first surface of at least one of the leg portions being in contact with at least one of the integrated circuit elements, and at least one of the leg portions in contact with the leg portion of another one of the unshaped members; and
- a first cooling plate arrangement having a coolant channel with a first end coupled to the second coolant port and a second end coupled to the heat exchanger and in thermal contact with the top portions of the u-shaped members.

* * * * *